US012628679B2

(12) United States Patent
Kim

(10) Patent No.: US 12,628,679 B2
(45) Date of Patent: May 12, 2026

(54) SEMICONDUCTOR PACKAGE

(71) Applicant: Samsung Electronics Co., Ltd.,
Suwon-si (KR)

(72) Inventor: Jongyoun Kim, Suwon-si (KR)

(73) Assignee: **SAMSUNG ELECTRONICS CO.,
LTD.**, Suwon-si (KR)

( * ) Notice: Subject to any disclaimer, the term of this
patent is extended or adjusted under 35
U.S.C. 154(b) by 361 days.

(21) Appl. No.: 18/230,416

(22) Filed: Aug. 4, 2023

(65) Prior Publication Data

US 2024/0222244 A1       Jul. 4, 2024

(30) Foreign Application Priority Data

Dec. 30, 2022     (KR) ........................ 10-2022-0190349

(51) Int. Cl.
| | |
|---|---|
| *H10W 70/685* | (2026.01) |
| *H10W 70/60* | (2026.01) |
| *H10W 70/65* | (2026.01) |
| *H10W 72/00* | (2026.01) |
| *H10W 72/30* | (2026.01) |
| *H10W 74/00* | (2026.01) |
| *H10W 90/00* | (2026.01) |

(52) U.S. Cl.
CPC ......... *H10W 70/685* (2026.01); *H10W 70/65*
(2026.01); *H10W 90/00* (2026.01); *H10W
70/60* (2026.01); *H10W 72/331* (2026.01);
*H10W 72/877* (2026.01); *H10W 72/884*
(2026.01); *H10W 74/00* (2026.01); *H10W
90/722* (2026.01); *H10W 90/724* (2026.01);
*H10W 90/734* (2026.01); *H10W 90/754*
(2026.01)

(58) Field of Classification Search
CPC ......... H01L 23/49822; H01L 23/49838; H01L
24/16; H01L 24/29; H01L 24/32; H01L
24/73; H01L 25/105; H01L 24/48; H01L
2224/16227; H01L 2224/16238; H01L
2224/29011; H01L 2224/32225; H01L
2224/48227; H01L 2224/73253; H01L
2224/73265; H01L 2225/1041; H01L
2225/1058; H01L 2924/182; H01L
23/49816; H01L 23/5389; H01L 24/19;
H01L 24/20; H01L 24/04; H01L 23/3185;
H01L 23/552; H01L 2224/02331; H01L
2224/02333; H01L 2224/0235; H01L
2224/02371; H01L 2224/02373; H01L
2224/02379; H01L 2224/02381
See application file for complete search history.

(56) References Cited

U.S. PATENT DOCUMENTS

| | | | |
|---|---|---|---|
| 9,123,763 | B2 | 9/2015 | Yu et al. |
| 9,978,661 | B2 | 5/2018 | Im et al. |
| 10,242,972 | B2 | 3/2019 | Chen et al. |

(Continued)

*Primary Examiner* — Douglas W Owens
(74) *Attorney, Agent, or Firm* — Muir Patent Law, PLLC

(57) ABSTRACT

A semiconductor package includes a first redistribution
layer, a first semiconductor chip on the first redistribution
layer, a mold layer covering a side surface of the first
semiconductor chip and a top surface of the first redistribu-
tion layer and having an upper surface coplanar with an
upper surface of the first semiconductor chip, a metal layer
on the first semiconductor chip and the mold layer to be in
contact with upper surfaces of the mold layer and the first
semiconductor chip, and a second redistribution layer on the
metal layer.

20 Claims, 17 Drawing Sheets

(56)             References Cited

U.S. PATENT DOCUMENTS

| | | | | |
|---|---|---|---|---|
| 10,312,112 | B2 * | 6/2019 | Chuang | H01L 24/20 |
| 10,440,819 | B2 | 10/2019 | Vincent | |
| 2018/0366347 | A1 * | 12/2018 | Chuang | H01L 21/6835 |
| 2019/0229070 | A1 | 7/2019 | Kwon et al. | |
| 2019/0304803 | A1 * | 10/2019 | Hu | H01L 24/20 |
| 2020/0365489 | A1 | 11/2020 | Su et al. | |
| 2021/0036413 | A1 * | 2/2021 | Kim | H01L 24/24 |
| 2022/0102309 | A1 | 3/2022 | Lee et al. | |
| 2023/0197543 | A1 * | 6/2023 | He | H01L 23/5383 |
| | | | | 257/787 |
| 2023/0420331 | A1 * | 12/2023 | Wu | H01L 21/6835 |
| 2024/0105569 | A1 * | 3/2024 | Kwak | H01L 23/5385 |
| 2024/0371739 | A1 * | 11/2024 | Chen | H01L 24/32 |
| 2024/0373561 | A1 * | 11/2024 | Park | H01L 23/49822 |
| 2025/0210567 | A1 * | 6/2025 | Mun | H01L 23/5383 |

* cited by examiner

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2022-0190349, filed on Dec. 30, 2022 in the Korean Intellectual Property Office, the entire contents of which are hereby incorporated by reference.

BACKGROUND OF THE INVENTION

The present disclosure relates to a semiconductor package.

A semiconductor package is provided to implement an integrated circuit chip to qualify for use in electronic products. Typically, a semiconductor package includes a semiconductor chip, which is mounted on a printed circuit board (PCB), and bonding wires or bumps, which electrically connect the semiconductor chip to the printed circuit board. With the development of electronics industry, various research has been conducted to improve reliability and durability of semiconductor packages.

SUMMARY

An object of the present disclosure is to provide a semiconductor package with improved reliability.

A semiconductor package according to some embodiments of the present disclosure includes a first redistribution layer, a first semiconductor chip disposed on the first redistribution layer, a mold layer covering a side surface of the first semiconductor chip and a top surface of the first redistribution layer and having an upper surface coplanar with an upper surface of the first semiconductor chip, a metal layer disposed on the first semiconductor chip and the mold layer to be in contact with upper surfaces of the mold layer and the first semiconductor chip, and a second redistribution layer disposed on the metal layer.

A semiconductor package according to some embodiments of the present disclosure includes a first redistribution layer, a first semiconductor chip disposed on the first redistribution layer, a plurality of mold vias spaced apart from the first semiconductor chip on the first redistribution layer and having the same height as the first semiconductor chip, a mold layer covering a side surface of the first semiconductor chip and a top surface of the first redistribution layer, having an upper surface coplanar with an upper surface of the first semiconductor chip, and having a recess region formed on the upper surface thereof, a metal layer disposed on the mold layer to fill the recess region, and a second redistribution layer disposed on the metal layer.

A semiconductor package according to some embodiments of the present disclosure includes a first redistribution layer, a first semiconductor chip disposed on the first redistribution layer, a plurality of mold vias extending parallel to side surfaces of the first semiconductor chip on the first redistribution layer and having the same height as the first semiconductor chip, the plurality of mold vias including a first mold via configured such that a ground voltage is applied to the first mold via and a second mold via configured such that a signal voltage is applied to the second mold via, a mold layer covering a side surface of the first semiconductor chip, a side surface of each of the plurality of mold vias, and a top surface of the first redistribution layer, having an upper surface coplanar with an upper surface of the first semiconductor chip, and having a recessed region formed on the upper surface thereof, a metal layer disposed on the mold layer to fill the recess region, the metal layer including a first part connected to the first mold via, and a second part connected to the second mold via and spaced apart from the first part, and a second redistribution layer disposed on the metal layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 8 is a cross-sectional view illustrating a semiconductor package according to some embodiments of the present disclosure.

DETAILED DESCRIPTION

Hereinafter, to explain the present disclosure in more detail, embodiments according to the present disclosure will be described in more detail with reference to the accompanying drawings.

Figure 1:
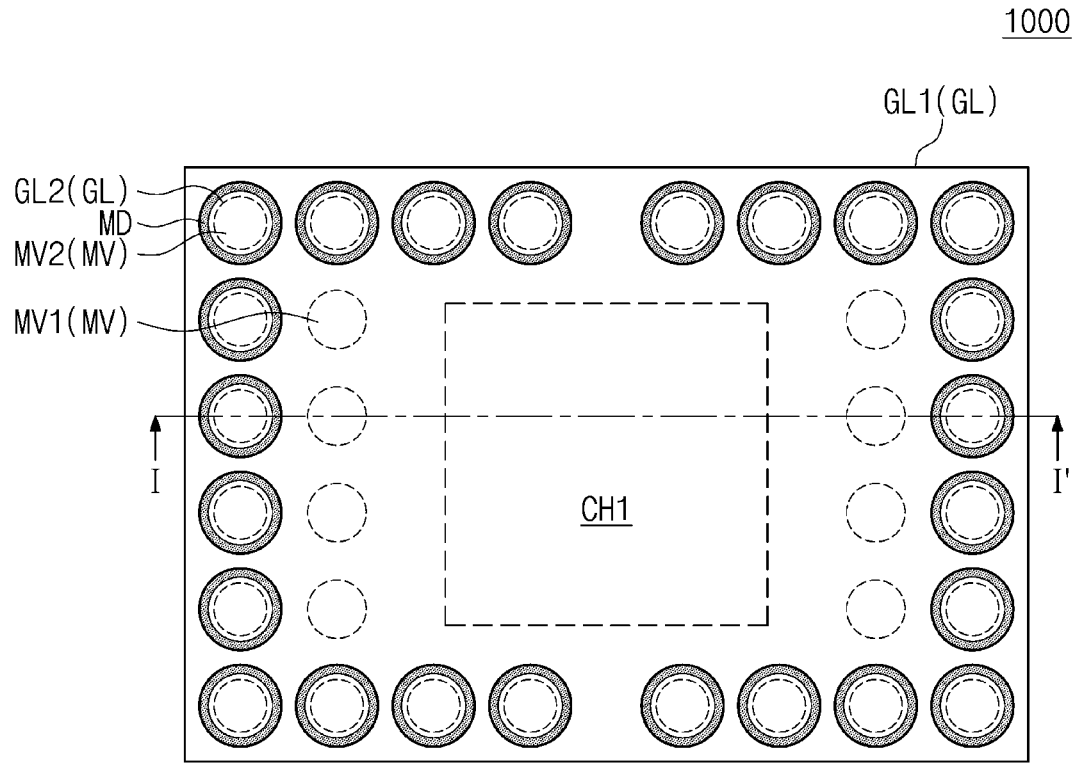
FIG. 1 is a plan view illustrating a semiconductor package according to some embodiments of the present disclosure.
Figure 2A:
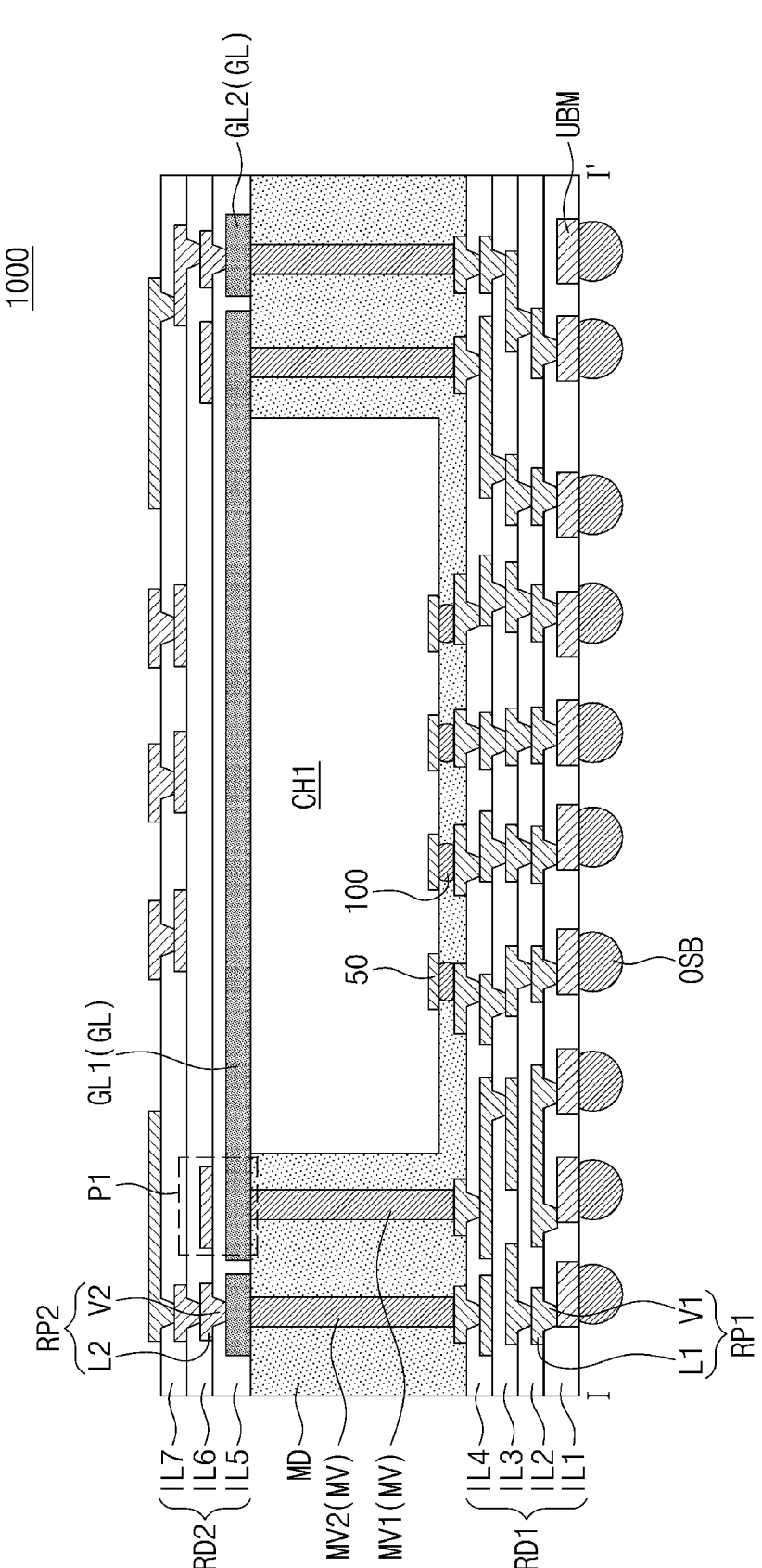
FIG. 2A is a cross-sectional view taken along line I-I' of the semiconductor package of FIG. 1.
Figure 2B:
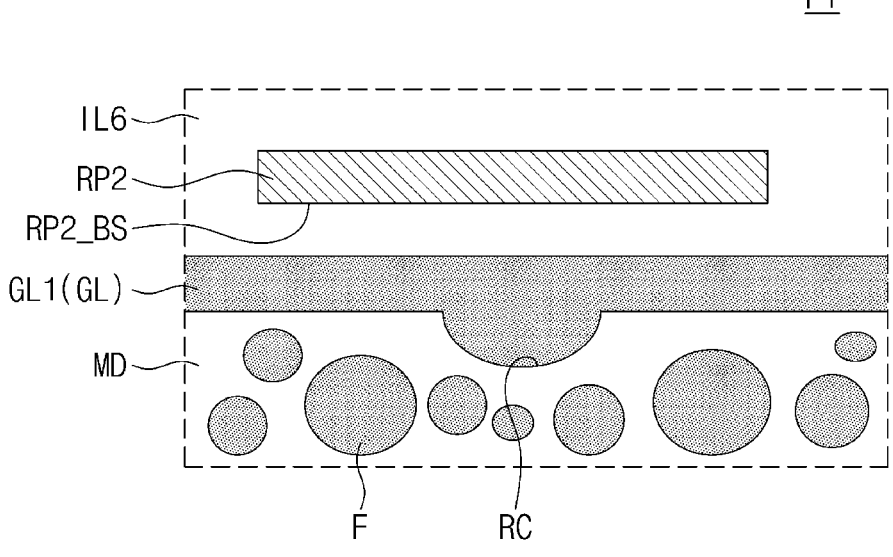
FIG. 2B is an enlarged view illustrating a portion 'P1' of FIG. 2A.

FIG. 1 is a plan view illustrating a semiconductor package according to some embodiments of the present disclosure, FIG. 2A is a cross-sectional view taken along line I-I' of the semiconductor package of FIG. 1, and FIG. 2B is an enlarged view illustrating a portion 'P1' of FIG. 2A.

The semiconductor package according to the present example may have a chip last fan-out wafer level package (FOWLP) form.

First, referring to FIGS. 1 and 2A, a semiconductor package 1000 according to the present example includes a first redistribution layer RD1, a first semiconductor chip CH1, a mold layer MD, a mold via MV, a metal layer GL, and a second redistribution layer RD2. The first and second redistribution layers may be redistribution substrates. For example, the first and second redistribution layers may be substrates.

The first redistribution layer RD1 may include or be formed of redistribution insulating layers IL1 to IL4 and first redistribution patterns RP1.

The first redistribution insulating layer IL1 may include or be formed of an insulating polymer or a photoimageable dielectric (PID). For example, the photoimageable dielectric may include or may be at least one of photosensitive polyimide, polybenzoxazole (PBO), phenol-based polymer, and/or benzocyclobutene-based polymer.

An under bump pattern UBM may be disposed in the first redistribution layer IL1. The under bump pattern UBM may include or be formed of a conductive material, for example, copper.

A plurality of first redistribution patterns RP1 may be provided in the first redistribution layer IL1. As shown in FIG. 2A, each of the first redistribution patterns RP1 may include or be formed of a first wiring part L1 and a first via part V1. The first via part V1 of the first redistribution pattern RP1 may be disposed within the first redistribution layer IL1. In this specification, a via part of a conductive component may be a part for vertical connection (e.g., vertical electrical connection), and a wiring part of a certain conductive component may be a part for horizontal connection (e.g., horizontal electrical connection). In this case, a width of the wiring part may be greater than that of the via part. The first wiring part L1 may extend in a direction parallel to an upper surface of the first redistribution layer RD1. A width of the first wiring part L1 may be greater than that of the first via part V1. The first via part V1 may be disposed under the first wiring part L1. The first via part V1 may protrude (e.g., downwardly) from a lower surface of the first wiring part L1. An uppermost width of the first via part V1 may be greater than a width of a lowermost portion of the first via part V1. The widths of the via part V1 may be horizontal distances between opposite side surfaces of the first via part V1. The first redistribution patterns RP1 may include or be formed of a conductive material, and may include or be formed of, for example, at least one of copper (Cu), tungsten (W), and titanium (Ti).

The first redistribution layer RD1 may further include a second redistribution insulating layer IL2, a third redistribution insulating layer IL3, and a fourth redistribution insulating layer IL4, and first redistribution patterns RP1 may be disposed in each of the second to fourth redistribution insulating layers IL2 to IL4.

In this example, although the first redistribution layer RD1 is illustrated as including four redistribution insulating layers IL1 to IL4, the first redistribution layer RD1 is not limited thereto. For example, the first redistribution layer RD1 may include less than three redistribution insulating layers or more than five redistribution insulating layers having first redistribution patterns RP1 provided therein.

External connection terminals OSB may be bonded to lower surfaces of the under bump patterns UBM, respectively. The external connection terminals OSB may be in contact with the lower surfaces of the under bump patterns UBM, respectively. The external connection terminals OSB may include or be formed of a conductive material, and may include or be formed of, for example, at least one of nickel (Ni), tin (Sn), and silver (Ag).

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The first semiconductor chip CH1 may be disposed on the first redistribution layer RD1. The first semiconductor chip CH1 may include or may be a logic chip, a buffer chip, or a system on chip (SOC). For example, the first semiconductor chip may be an ASIC chip or an application processor (AP) chip. The ASIC chip may include or may be an application specific integrated circuit (ASIC). The first semiconductor chip CH1 may include or may be a central processing unit (CPU) or a graphic processing unit (GPU).

The first semiconductor chip CH1 may include chip pads 50. Some of the first redistribution patterns RP1 on the fourth redistribution layer IL4 may be in contact with the chip pads 50. The chip pads 50 of the first semiconductor chip CH1 may be electrically connected to some of the first redistribution patterns RP1 of the fourth redistribution insulating layer IL4 by internal connection members 100, respectively. The chip pads 50 and the internal connection members 100 may include or be formed of a conductive material. The chip pads 50 may include or be formed of, for example, one of aluminum (Al) and copper (Cu). The internal connection members 100 may include or be formed of, for example, at least one of copper (Cu), nickel (Ni), tin (Sn), and silver (Ag).

As used herein, components described as being "electrically connected" are configured such that an electrical signal can be transferred from one component to the other (although such electrical signal may be attenuated in strength as it transferred and may be selectively transferred).

The mold layer MD may cover the first semiconductor chip CH1 on the first redistribution layer RD1. In this case, the mold layer MD may have an upper surface that is coplanar with an upper surface of the first semiconductor chip CH1. The mold layer MD may cover a side surface of the first semiconductor chip CH1 and the first redistribution layer RD1. The mold layer MD may contact the side surface and a bottom surface of the first semiconductor chip CH1 and a top surface of the first redistribution layer RD1.

The mold layer MD may include, for example, an insulating polymer such as an epoxy molding compound (EMC). The mold layer MD may further include fillers F as shown in FIG. 2B, and the fillers F may be dispersed in an insulating resin. For example, the fillers F may be formed of a plurality of particles. The plurality of filler particles F may include or be formed of silica. The plurality of filler particles F may improve mechanical strength and insulating properties of the mold layer MD.

The mold layer MD may be interposed between the first redistribution layer RD1 and the second redistribution layer RD2 described below. The mold layer MD may seal between an upper surface of the first redistribution layer RD1 and a lower surface of the second redistribution layer RD2.

The mold via MV may penetrate the mold layer MD and electrically connect the first redistribution layer RD1 and the metal layer GL, which will be described in more detail later. The mold via MV may be disposed on (e.g., contact) the upper surface of the first redistribution layer RD1 and be in contact with a lower surface of the metal layer GL. The mold via MV may be electrically connected to one of the uppermost first redistribution patterns RP1 and the corresponding metal layer GL.

A plurality of mold vias MV may be provided in the semiconductor package 1000. The mold vias MV may include a first mold via MV1 to which a ground voltage is applied and a second mold via MV2 to which a signal voltage is applied.

The mold vias MV may be horizontally spaced apart from the first semiconductor chip CH1. The mold vias MV may be arranged to surround the first semiconductor chip CH1, e.g., when viewed in a plan view. The mold vias MV may be metal pillars, and may include or be formed of, for example, copper (Cu). As shown in FIG. 1, a plurality of first mold vias MV1 and a plurality of second mold vias MV2 may be provided in the semiconductor package 1000.

The mold vias MV may have the same height as the first semiconductor chip CH1. Accordingly, the upper surface of the mold layer MD may be coplanar with the upper surface of the mold vias MV, similarly to the first semiconductor chip CH1.

The metal layer GL may be disposed on the first semiconductor chip CH1 and the mold layer MD. The metal layer GL may be disposed to be in contact with upper surfaces of the mold layer MD, mold vias MV, and first semiconductor chip CH1.

The metal layer GL may include a first part GL1 connected to (e.g., contact) the first mold via MV1 and a second part GL2 connected to (e.g., contact) the second mold via MV2 and spaced apart from the first part GL1. For example, the first part GL1 is connected to the first mold via MV1 to which the ground voltage is applied. Accordingly, the ground voltage may be applied to the first part GL1 as well. For example, the first part GL1 may be electrically connected to (e.g., contact) the first mold via MV1.

The first part GL1 may extend to cover the upper surfaces of the first semiconductor chip CH1 and first mold via MV1. The first part GL1 may simultaneously cover (e.g., vertically overlap) the upper surfaces of the first semiconductor chip CH1 and first mold via MV1 and may serve as an electromagnetic interference (EMI) shield. Accordingly, electrical characteristics of the semiconductor package may be improved.

The second part GL2 may be connected to (e.g., contact) the second mold via MV2 to which the signal voltage is applied. A plurality of second parts GL2 of the metal layer GL may be provided in a one-to-one correspondence with the second mold vias MV2. The second part GL2 may have a pad shape. Each of the second parts GL2 of the metal layer GL may be connected to (e.g., contact) a corresponding one of the second mold vias MV2 to which the signal voltage is applied, and the signal voltage applied to each of the second mold vias MV2 may be transferred to the second redistribution layer RD2 to be described later.

The second redistribution layer RD2 may cover (e.g., vertically overlap) the upper surfaces of the mold layer MD and metal layer GL.

The second redistribution layer RD2 may include a fifth redistribution insulating layer IL5. The fifth redistribution insulating layer IL5 may include or be formed of an insulating polymer or a photoimageable dielectric (PID). For example, the photoimageable dielectric may include or be formed of at least one of photosensitive polyimide, polybenzoxazole (PBO), phenol-based polymer, and/or benzocyclobutene-based polymer.

The fifth redistribution insulating layer IL5 may cover (e.g., vertically overlap) the metal layer GL. The fifth redistribution layer IL5 may fill a space between the first part GL1 and the second part GL2 of the metal layer GL. For example, the fifth redistribution layer IL5 may overlap the first part GL1 and the second part GL2 of the metal layer GL in a horizontal direction.

A plurality of second redistribution patterns RP2 may be provided in the second redistribution layer RD2. As shown in FIG. 2A, each of the second redistribution patterns RP2 may include a second wiring part L2 and a second via part V2. The second via part V2 of the second redistribution pattern RP2 may be disposed within the fifth redistribution insulating layer IL5. For example, the second via part V2 of the second redistribution pattern RP2 may fully overlap the fifth redistribution insulating layer IL5 in a horizontal direction.

The second wiring part L2 may extend in a direction parallel to an upper surface of the second redistribution layer RD2. A width of the second wiring part L2 may be greater than a width of the second via part V2. The widths of the second wiring part L2 and the second via part V2 may be respective horizontal distances in a direction perpendicular to a lengthwise direction of the second wiring part L2. The second via part V2 may be disposed below the second wiring part L2. For example, the second wiring part L7 may fully overlap the second via part V2 in the vertical direction as shown in FIG. 2A. The second via part V2 may protrude toward a lower surface of the second redistribution layer RD2. For example, the second via part V2 may protrude downward from a bottom surface of the second wiring part L2 A lowermost width of the second via part V2 may be smaller than a width of an uppermost portion of the second via part V2. The second redistribution pattern RP2 may include or be formed of a conductive material, and may include or be formed of, for example, at least one of copper (Cu), tungsten (W), and titanium (Ti).

The second redistribution layer RD2 may further include a sixth redistribution insulating layer IL6 and a seventh redistribution insulating layer IL7, and each of the sixth and seventh redistribution insulating layers IL6 and IL7 may include second redistribution patterns RP2, similar to the fifth redistribution layer IL5. For example, the second redistribution patterns RP2 may be formed in the respective sixth and seventh redistribution insulating layers IL6 and IL7.

In this example, the second redistribution layer RD2 is illustrated as including three redistribution insulating layers, but is not limited thereto, and the second redistribution layer RD2 may include two, four or more redistribution insulating layers provided with the second redistribution pattern RP2 therein.

Some of the first and second redistribution patterns RP1 and RP2 may transmit power, and the other first and second redistribution patterns RP1 and RP2 may transmit (command/access/input/output) signals. The first and second redistribution patterns RP1 and RP2 may include power vias and signal vias.

Referring to FIG. 2B, a recess region RC may be formed on an upper/top surface of the mold layer MD. The recess region RC may have a concave shape toward a bottom.

A portion of the metal layer GL fills the recess region RC. An upper/top surface of the metal layer GL may be flat. For example, the top surface of the metal layer GL may be smoother than the top surface of the mold layer MD. One of the second redistribution patterns RP2 included in the second redistribution layer RD2 overlaps the recess region RC, e.g., in the vertical direction. A lower/bottom surface RP2_BS of one of the second redistribution patterns RP2 may be flat.

In a manufacturing process of the semiconductor package of FIGS. 3A to 3I to be described later, a grinding process of the mold layer MD is performed to expose the upper surface of the mold via MV, and then the second redistribution layer RD2 is formed thereon. At this time, the recess region RC may be formed on a portion of the upper surface of the mold layer MD by the grinding process and defects may occur due to a step caused by the recess region RC in the second redistribution pattern RP2 of the second redistribution layer RD2 when the second redistribution layer RD2 is disposed on the upper surface of the mold layer MD having the recess region RC.

In the semiconductor package 1000 according to the present example, the metal layer GL may fill the recess region RC and eliminates the step caused by the recess region RC, and thus shape defects (e.g., a short circuit) of the second redistribution pattern RP2 may be prevented. Accordingly, reliability of the semiconductor package may be improved.

Furthermore, as the metal layer GL is disposed on the first semiconductor chip CH1 and the mold layer MD, heat generated in the first semiconductor chip CH1 may be dispersed and dissipated through the metal layer GL. Accordingly, the reliability of the semiconductor package may be improved.

FIGS. 3A to 3I are cross-sectional views sequentially illustrating a process of manufacturing the semiconductor package of FIG. 2A.

Figure 3A:
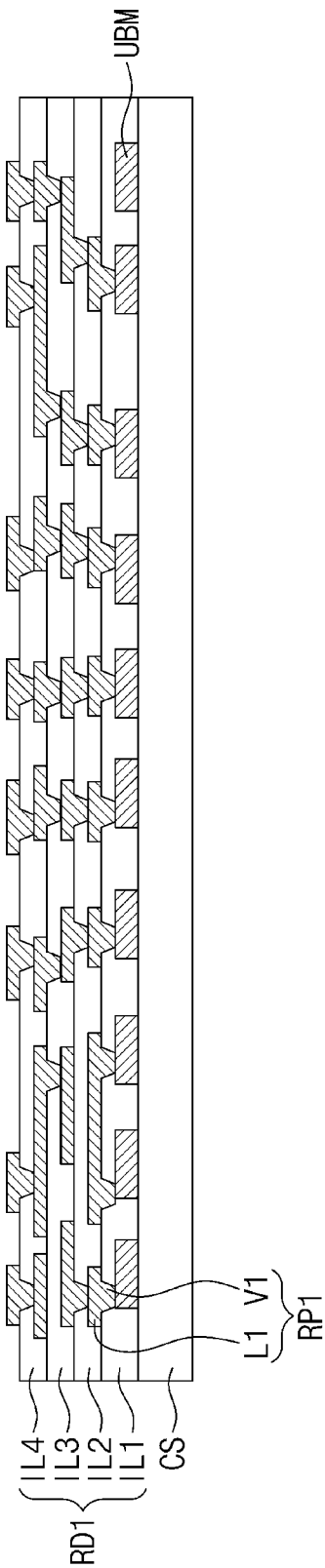
FIGS. 3A to 3I are cross-sectional views sequentially illustrating a process of manufacturing the semiconductor package of FIG. 2A.

Referring to FIG. 3A, a first redistribution layer RD1 is formed on a carrier substrate CS.

The carrier substrate CS may include or be formed of a polymer. In certain embodiments, the carrier substrate CS may include an adhesive tape, and thus, the first redistribution layer RD1 may be attached on the carrier substrate CS.

Figure 3B:
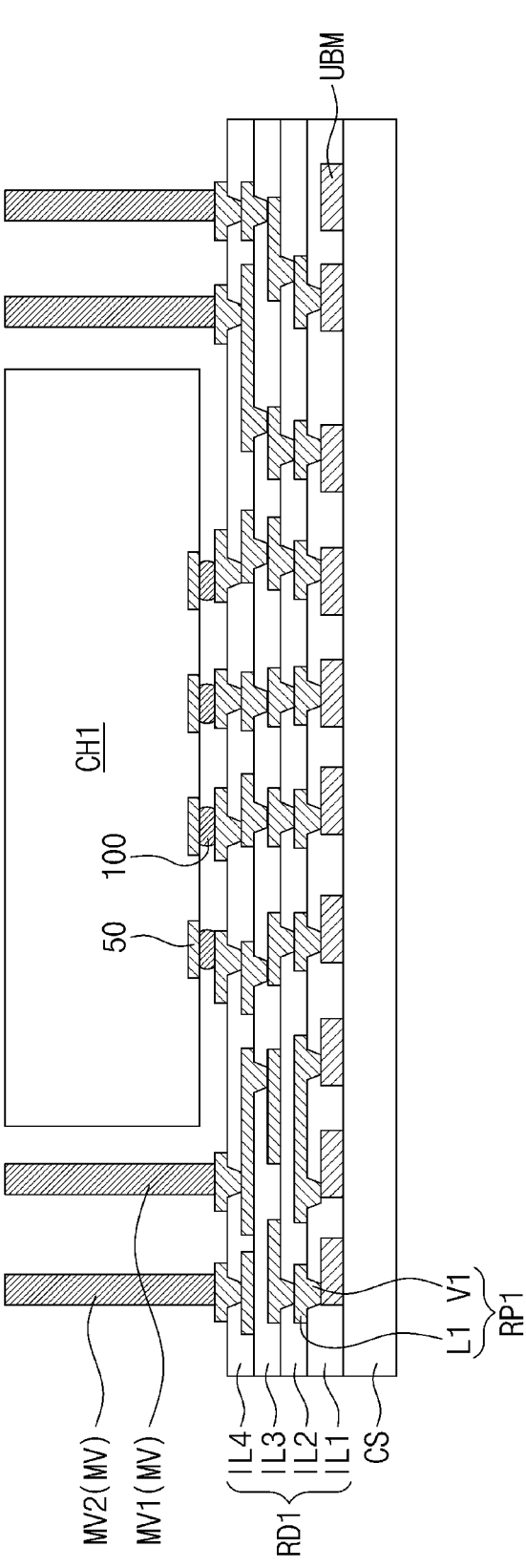

Referring to FIG. 3B, a plurality of mold vias MV and a first semiconductor chip CH1 are disposed on the first redistribution layer RD1. The first semiconductor chip CH1 may be mounted on the first redistribution layer RD1 through an internal connection member 100.

Figure 3C:
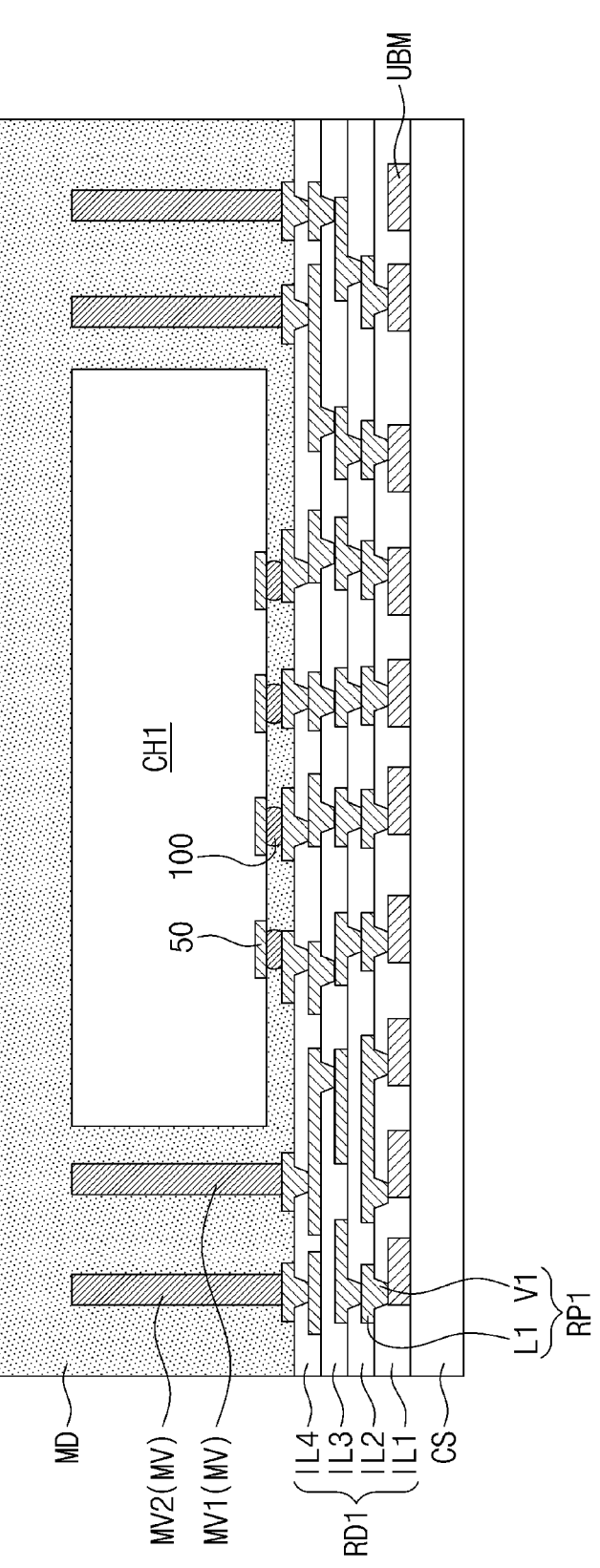

Referring to FIG. 3C, a mold layer MD is formed to cover the first redistribution layer RD1, the first semiconductor chip CH1, and the plurality of mold vias MV. In this case, the mold layer MD may completely cover the first redistribution layer RD1, the first semiconductor chip CH1, and the plurality of mold vias MV. For example, a top surface of the mold layer MD may fully overlap the first redistribution layer RD1, the first semiconductor chip CH1, and the plurality of mold vias MV in the vertical direction.

Figure 3D:
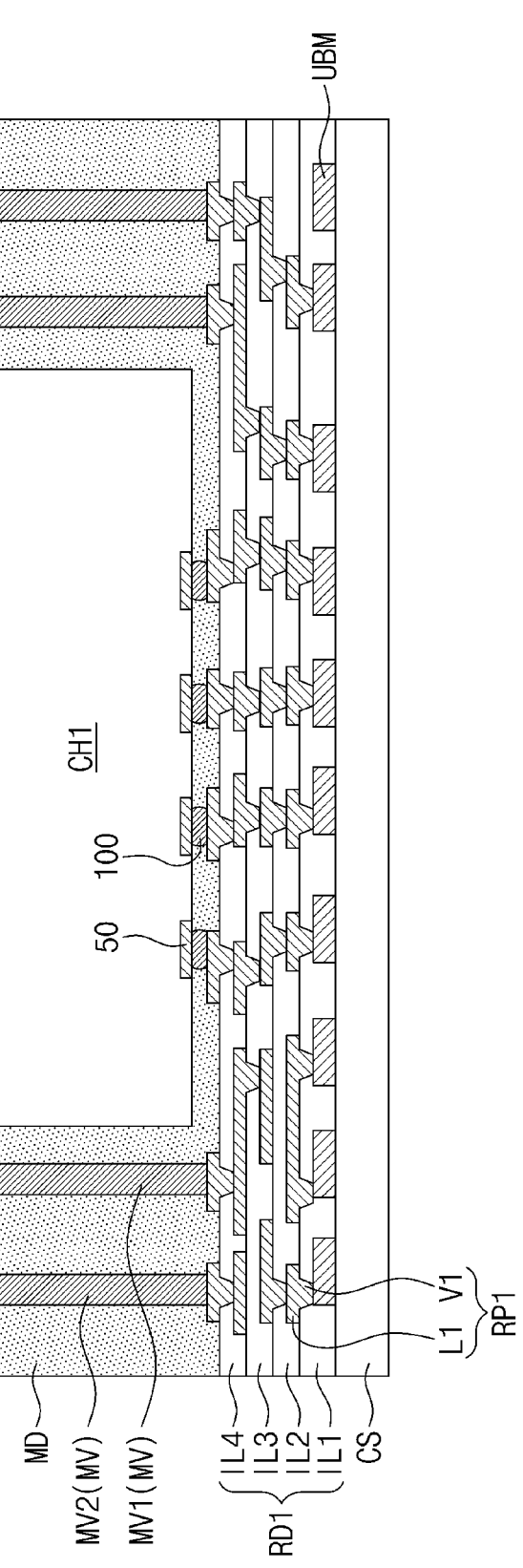

Referring to FIG. 3D, a grinding process is performed on the mold layer MD to remove a portion of the mold layer MD and expose upper surfaces of the first semiconductor chip CH1 and the mold vias MV. As a result, the top surface of the mold layer MD is coplanar with each top surface of the first semiconductor chip CH1 and the plurality of mold vias MV. At this time, the recess region of FIG. 2B (RC) may be formed.

Figure 3E:
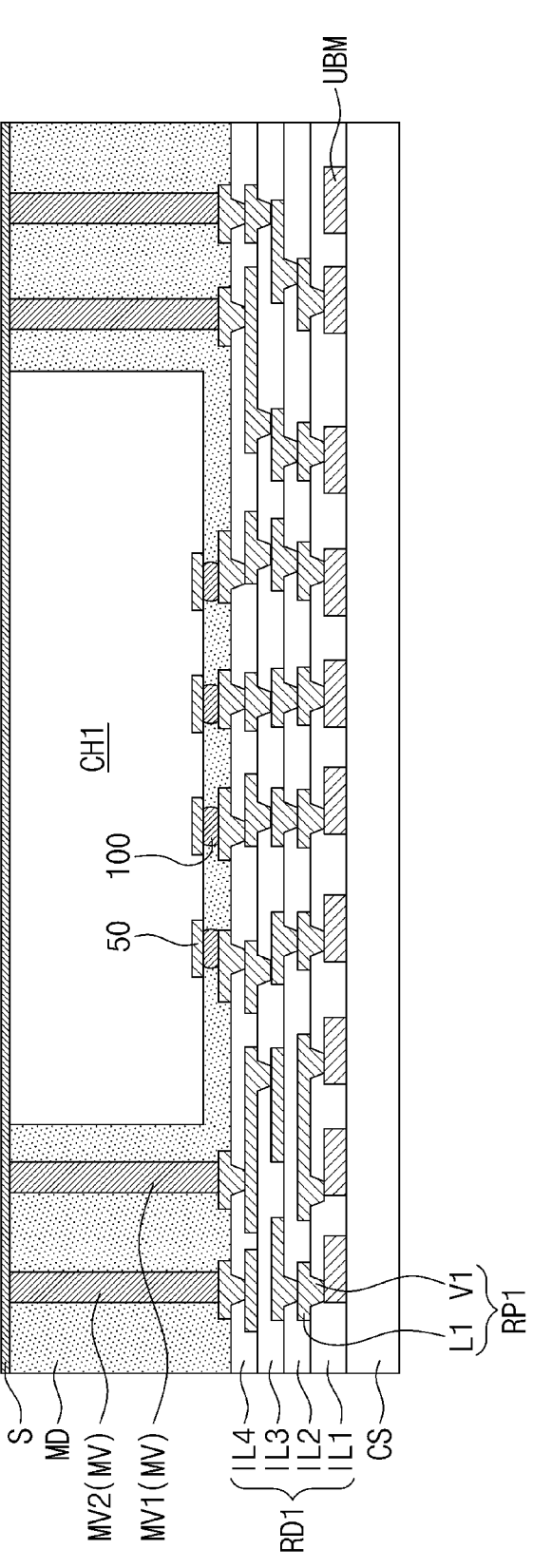

Referring to FIG. 3E, a seed layer S is conformally formed on the mold layer MD. The seed layer S may be deposited through chemical vapor deposition (CVD) or physical vapor deposition (PVD).

Figure 3F:
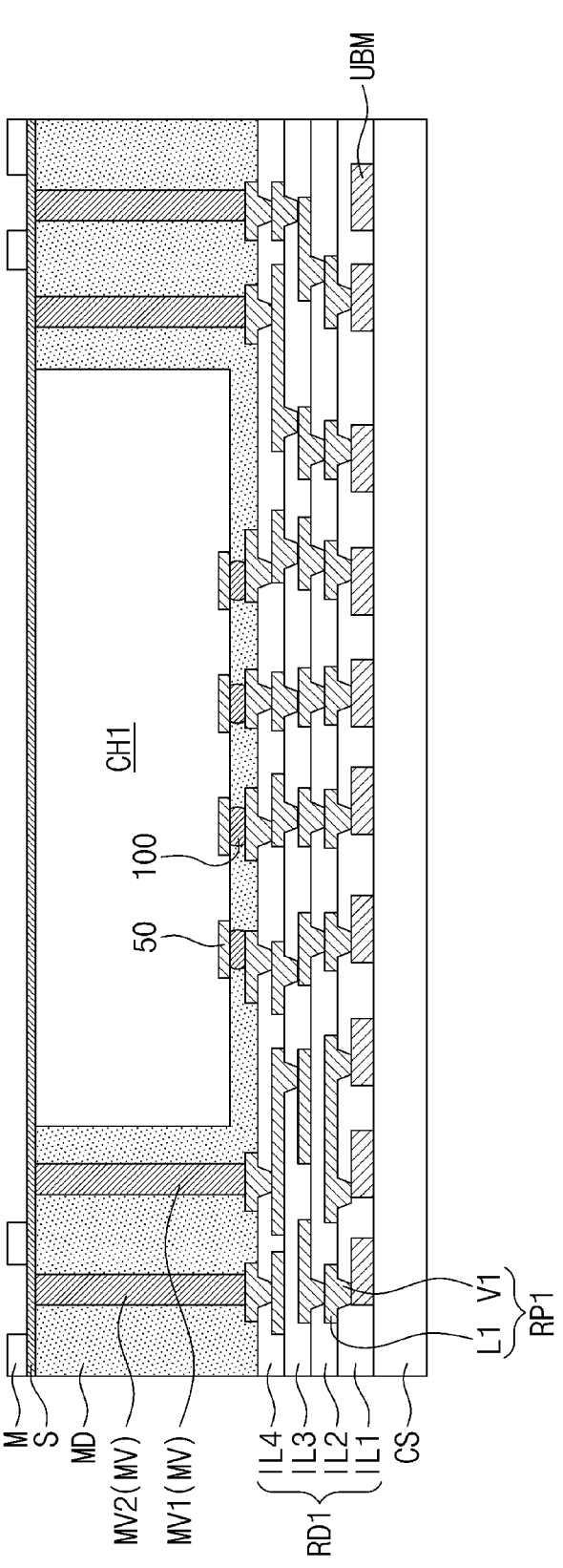

Referring to FIG. 3F, a mask pattern M is formed on the seed layer S. The mask pattern M may be formed of a photoresist. For example, the mask pattern M may be photoresist pattern.

Figure 3G:
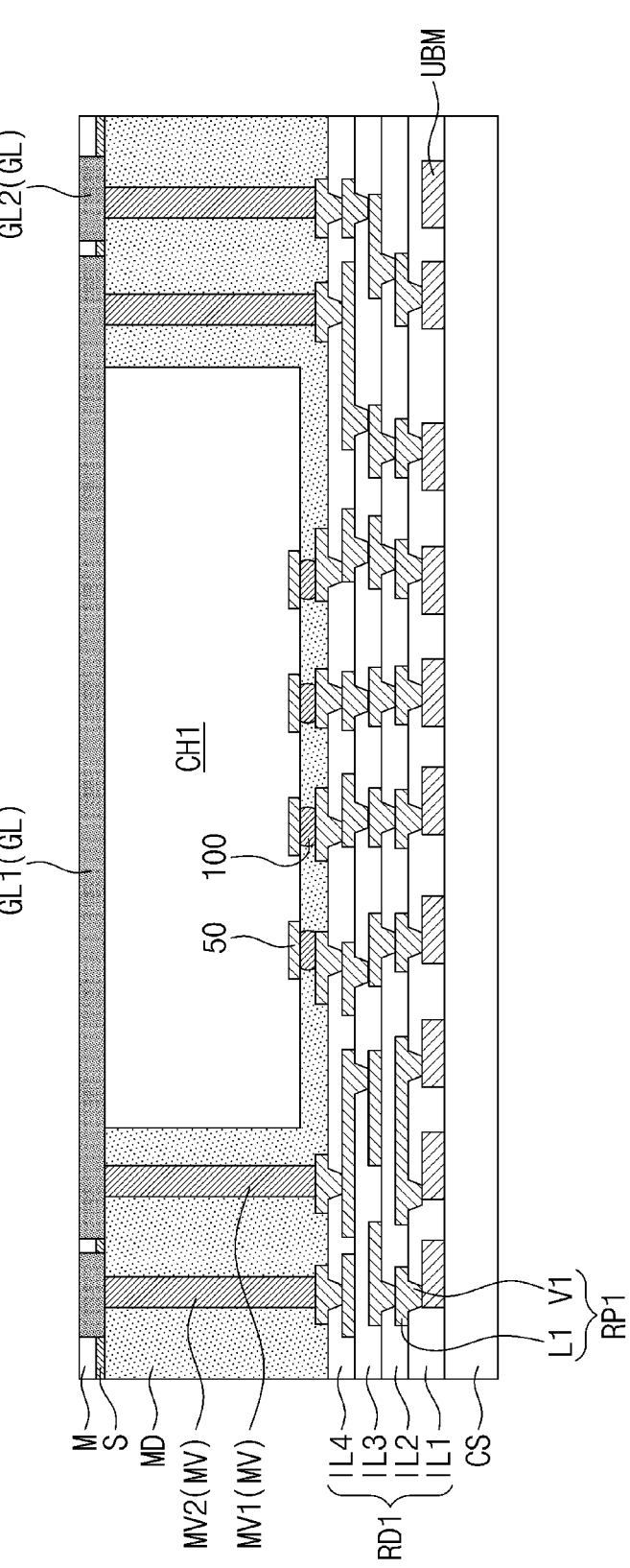

Referring to FIG. 3G, a metal layer GL is formed on the mold layer MD by performing a plating process. The metal layer GL may be formed through an electroless plating process. The metal layer GL may include at least one of copper (Cu), nickel (Ni), and gold (Au), and may include various other metals. The metal layer GL may fill the recess region RC of FIG. 2B.

Figure 3H:
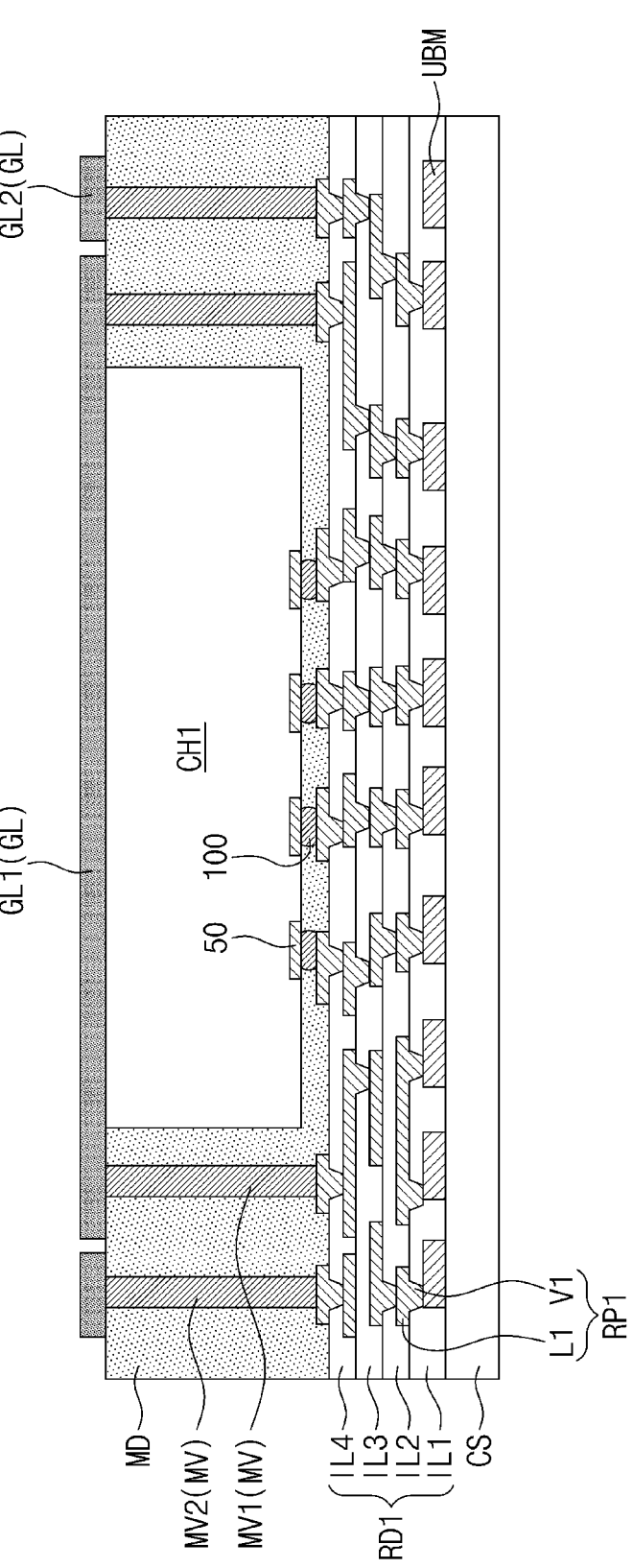

Referring to FIG. 3H, the mask pattern M and the seed layer S under the mask pattern M are removed. The mask pattern M may be removed by an ashing process. The seed layer S may be removed by a wet etching process. As a result, the mold layer MD may be exposed.

Figure 3I:
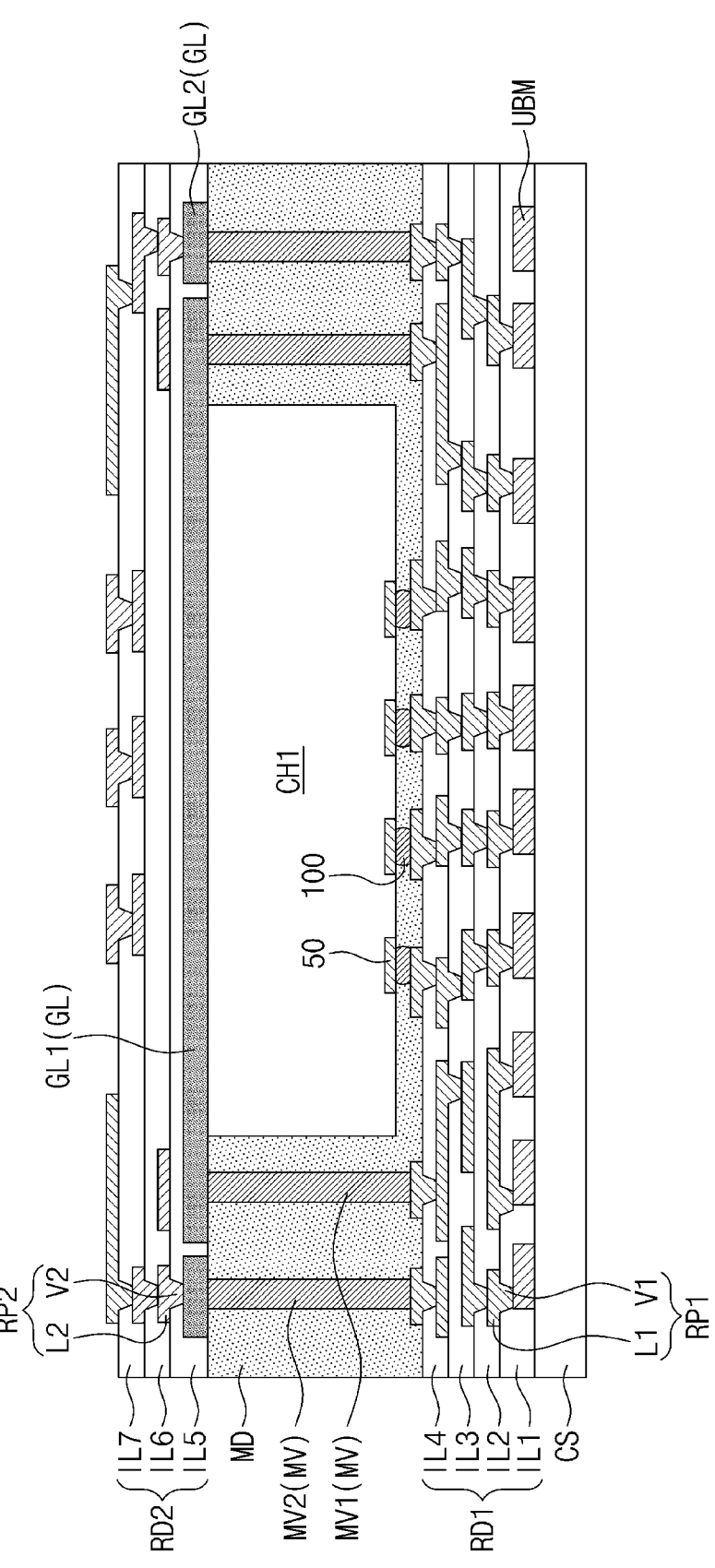

Referring to FIG. 3I, a second redistribution layer RD2 is formed on the metal layer GL.

Finally, the carrier substrate CS is removed. Referring back to FIG. 2A, external connection terminals OSB are bonded to a lower surface of the first redistribution layer RD1. Accordingly, the manufacture of the semiconductor package is completed.

Figure 4:
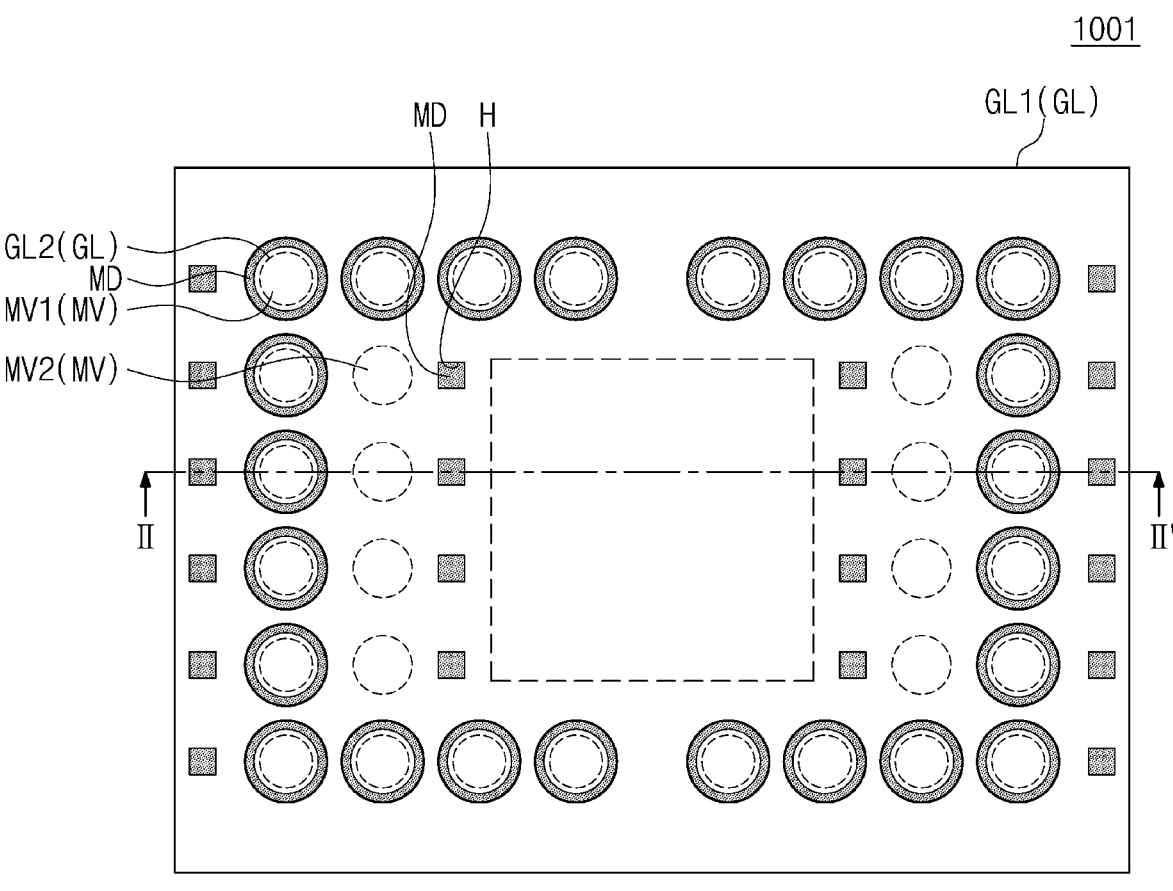
FIG. 4 is a plan view illustrating a semiconductor package according to some embodiments of the present disclosure.
Figure 5:
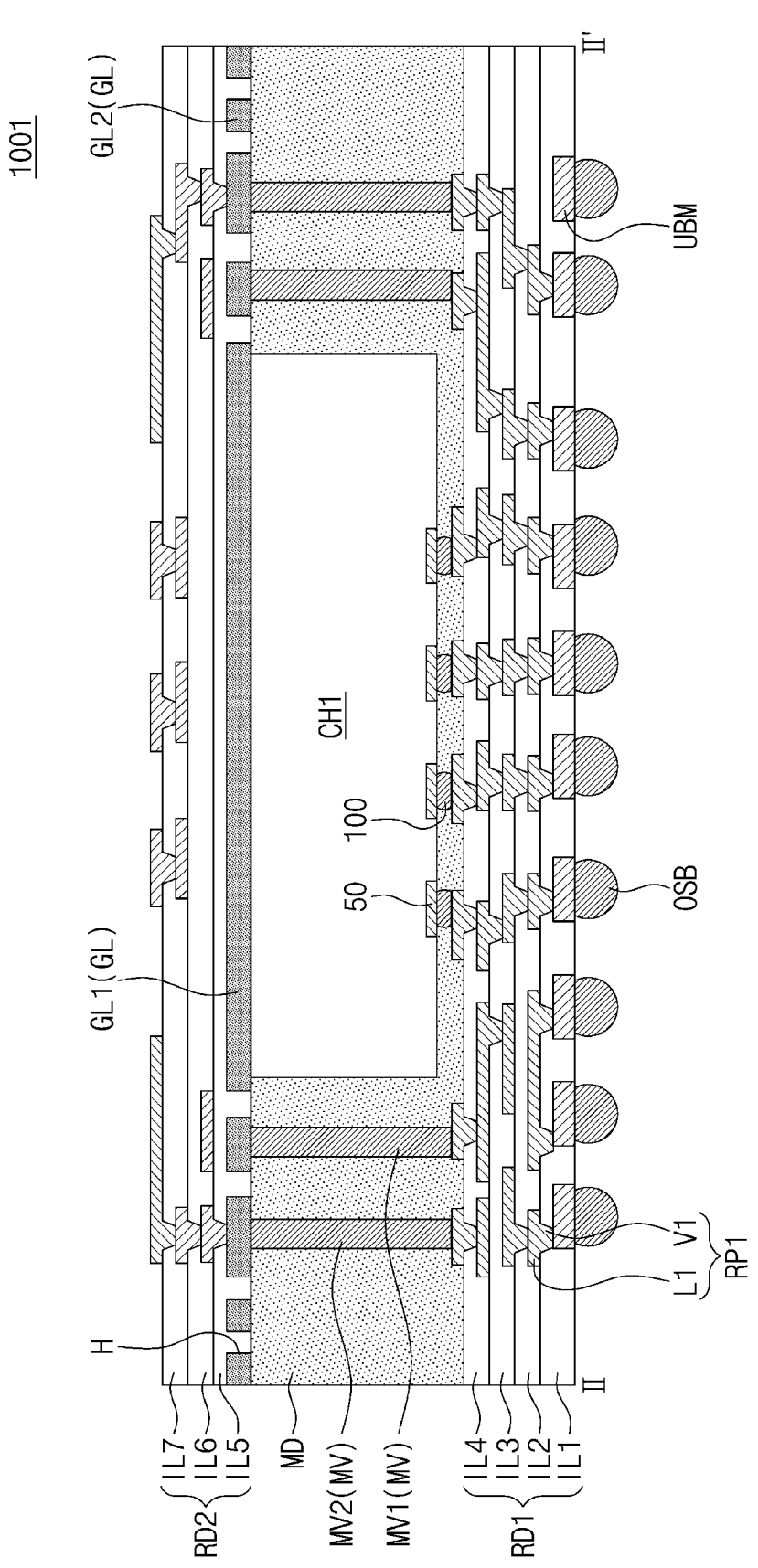
FIG. 5 is a cross-sectional view taken along line II-II' of the semiconductor package of FIG. 4.

FIG. 4 is a plan view illustrating a semiconductor package according to some embodiments of the present disclosure, and FIG. 5 is a cross-sectional view taken along line II-II' of the semiconductor package of FIG. 4.

A semiconductor package 1001 according to this example is the same as the semiconductor package 1000 described with reference to FIGS. 1 to 3I except that a metal layer GL of the semiconductor package 1000 includes a plurality of holes H. In the present example, the same reference numerals as the ones of the semiconductor package 1000 are used and duplicate descriptions are omitted.

Referring to FIGS. 4 and 5, the metal layer GL includes a plurality of holes H exposing the mold layer MD. The plurality of holes H may pass through the metal layer GL. The plurality of holes H may be spaced apart from each other, e.g., in a horizontal direction. The plurality of holes H may be arranged regularly or randomly. For example, as shown in FIG. 4, some of the holes H may be disposed on a straight line along with the first mold via MV1 and the second mold via MV2.

The plurality of holes H exposing the mold layer MD may be formed in the metal layer GL, and thus gases generated in the mold layer MD may be discharged to the outside. Other configurations may be the same as or similar to those described with reference to FIGS. 1 and 2.

Figure 6:
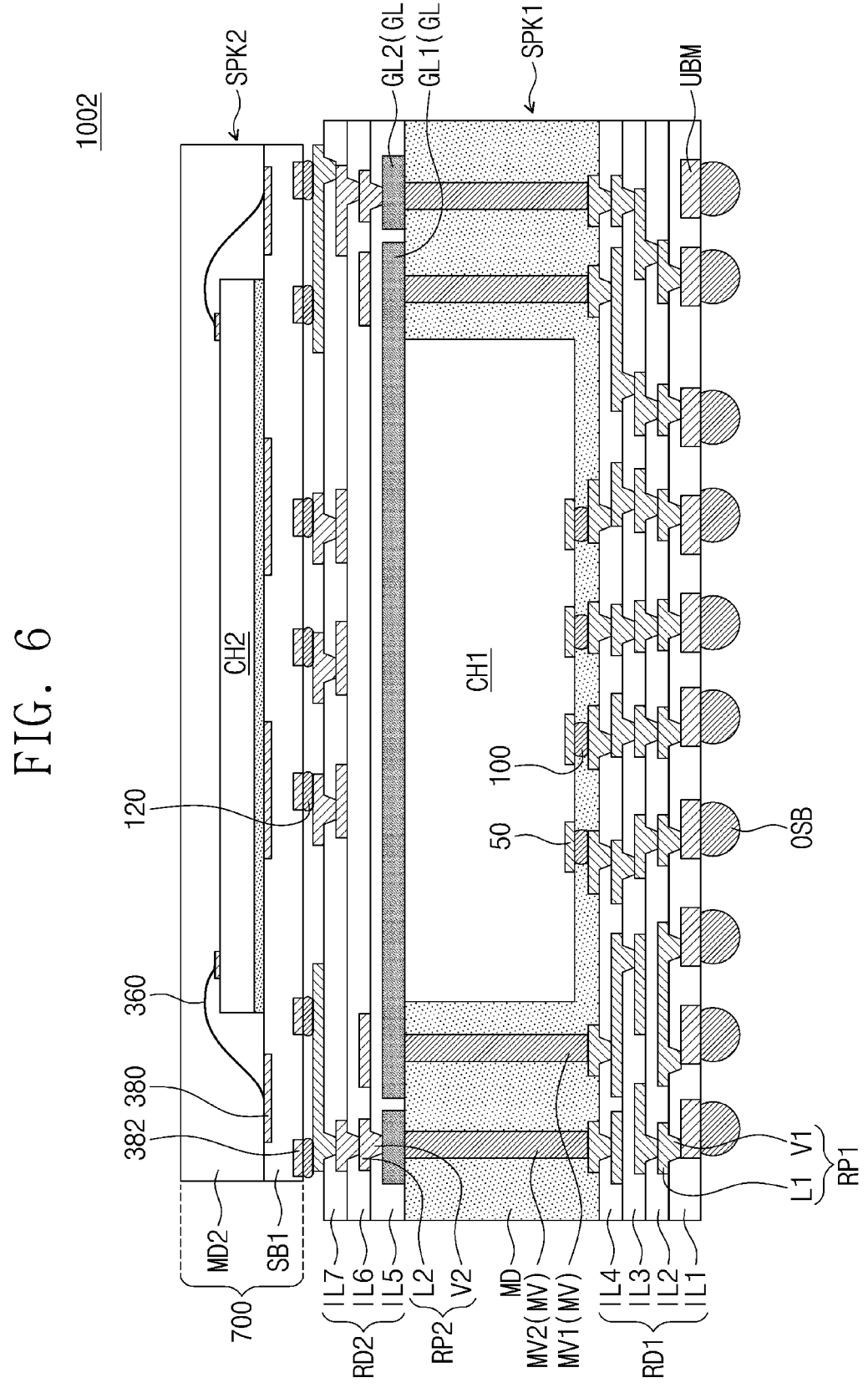
FIG. 6 is a cross-sectional view illustrating a semiconductor package according to some embodiments of the present disclosure.

FIG. 6 is a cross-sectional view illustrating a semiconductor package according to some embodiments of the present disclosure.

A semiconductor package 1002 according to the present example includes a first sub-semiconductor package SPK1 and a second sub-semiconductor package SPK2 stacked thereon. The first sub-semiconductor package SPK1 is the same as the semiconductor package 1000 which has been described with reference to FIGS. 1 to 3I. The same reference numerals are used and duplicate descriptions are omitted.

The semiconductor package 1002 according to the present example includes a first sub-semiconductor package SPK1 and a second sub-semiconductor package SPK2 stacked thereon. The first sub-semiconductor package SPK1 may have the same structure as or a similar structure to the semiconductor package 1000 of FIG. 2.

The second sub-semiconductor package SPK2 includes a first package substrate SB1, a second semiconductor chip CH2 mounted thereon, and a second mold layer MD2 covering the first package substrate SB1. For example, the second mold layer MD2 is formed on (e.g., contacts) a top surface of the first package substrate SB1. The second semiconductor chip CH2 may be electrically connected to the first package substrate SB1 through, for example, a wire 360.

The second semiconductor chip CH2 may be a semiconductor die or a semiconductor chip, or may be a semiconductor package including a plurality of semiconductor dies of the same type or different types of semiconductor dies. The second semiconductor chip CH2 may be one selected from an image sensor chip such as a CMOS imaging sensor (CIS), a memory device chip such as a flash memory chip, a DRAM chip, an SRAM chip, an EEPROM chip, a PRAM chip, an MRAM chip, a ReRAM chip, a high bandwidth memory (HBM) chip, a hybrid memory cubic (HMC) chip, a microelectromechanical system (MEMS) device chip, or an application-specific integrated circuit (ASIC) chip.

The second mold layer MD2 may include or be formed of the same material as the first mold layer MD1. The wire 360 may include or be formed of copper or gold. The first package substrate SB1 may be, for example, a double-sided or multi-layered printed circuit board. The first package substrate SB1 includes an upper conductive pattern 380 disposed on an upper surface thereof and a lower conductive pattern 382 disposed on a lower surface thereof. An internal wiring (not shown) may be disposed in the first package substrate SB1 to electrically connect the upper conductive pattern 380 and the lower conductive pattern 382. The upper conductive pattern 380 and the lower conductive pattern 382 may include or be formed of at least one of gold, copper, aluminum, and nickel.

The first sub-semiconductor package SPK1 and the second sub-semiconductor package SPK2 may be connected (e.g., electrically and/or physically) by an internal connection member 120. The internal connection member 120 electrically connects the lower conductive pattern 382 and an uppermost second redistribution patterns RP2 among the second redistribution patterns RP2. The internal connection member 120 may include or may be at least one of a solder ball, a conductive bump, and a conductive pillar. The internal connection member 120 may include or be formed of at least one of tin, lead, silver, copper, nickel, and gold. Other configurations may be the same as or similar to those described with reference to FIGS. 1 and 2.

Figure 7:
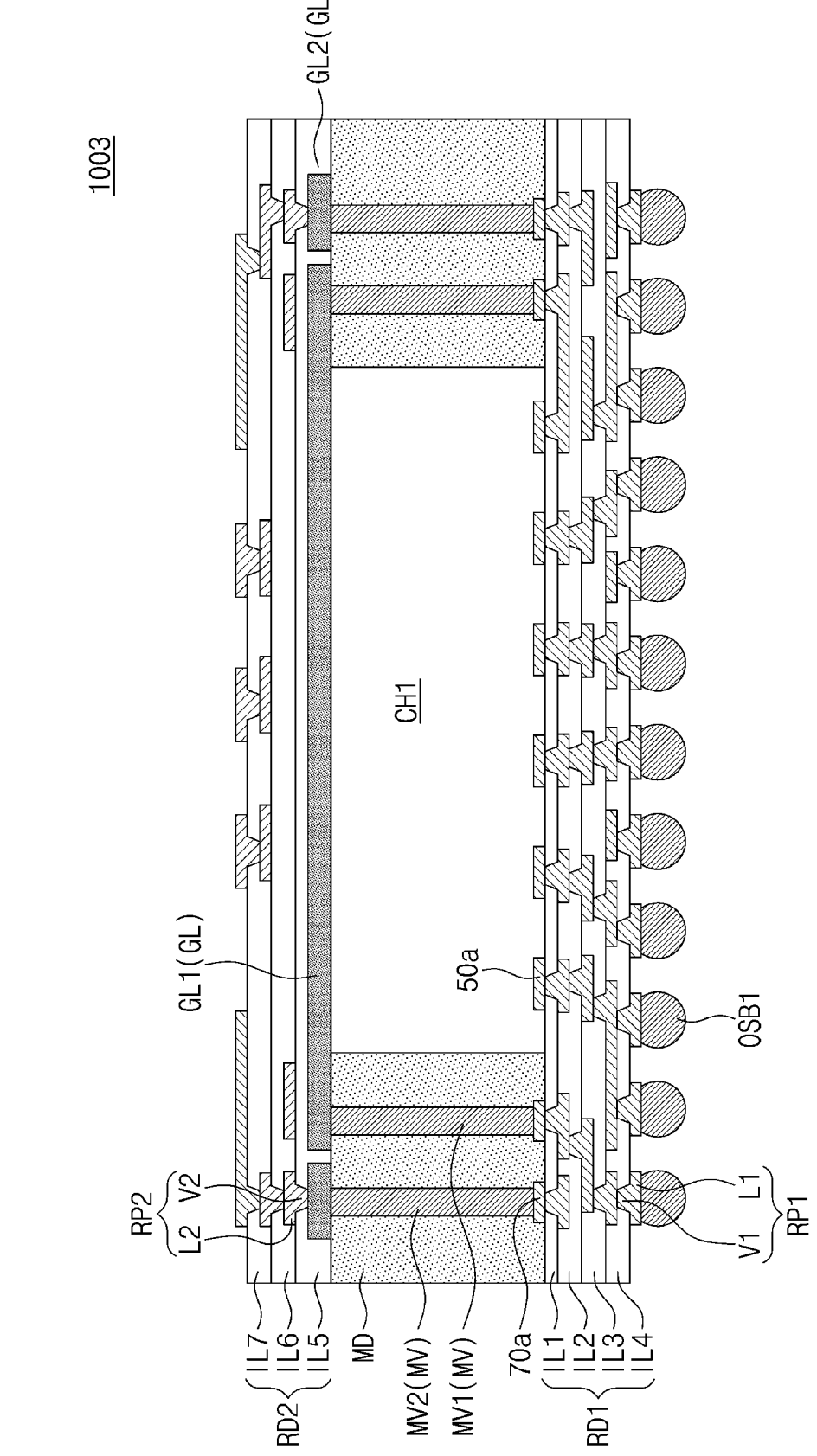
FIG. 7 is a cross-sectional view illustrating a semiconductor package according to some embodiments of the present disclosure.

FIG. 7 is a cross-sectional view illustrating a semiconductor package according to embodiments of the present disclosure.

Referring to FIG. 7, a semiconductor package 1003 according to the present example may have a chip first fan-out wafer level package (FOWLP) form.

In the semiconductor package 1003 according to the present example, after the second redistribution layer RD2 is disposed on the semiconductor chip CH1, the first redistribution layer RD1 may be formed under the semiconductor chip CH1.

External solder balls OSB1 may be bonded to the first redistribution pattern RP1 of the fourth redistribution layer IL4 in the first redistribution layer RD1.

The first semiconductor chip CH1 may include chip pads 50$a$ adjacent to (e.g., on) a lower/bottom surface thereof. The chip pads 50 may be connected to (e.g., contact) portions of the first redistribution patterns RP1 of the first redistribution layer IL1. In addition, chip pads 70$a$ are formed under each of the mold vias MV so that the plurality of mold vias MV are electrically connected to other portions of the first redistribution patterns RP1 of the first redistribution insulating layer IL1. Other configurations may be the same as or similar to those described with reference to FIGS. 1 and 2.

Figure 8:
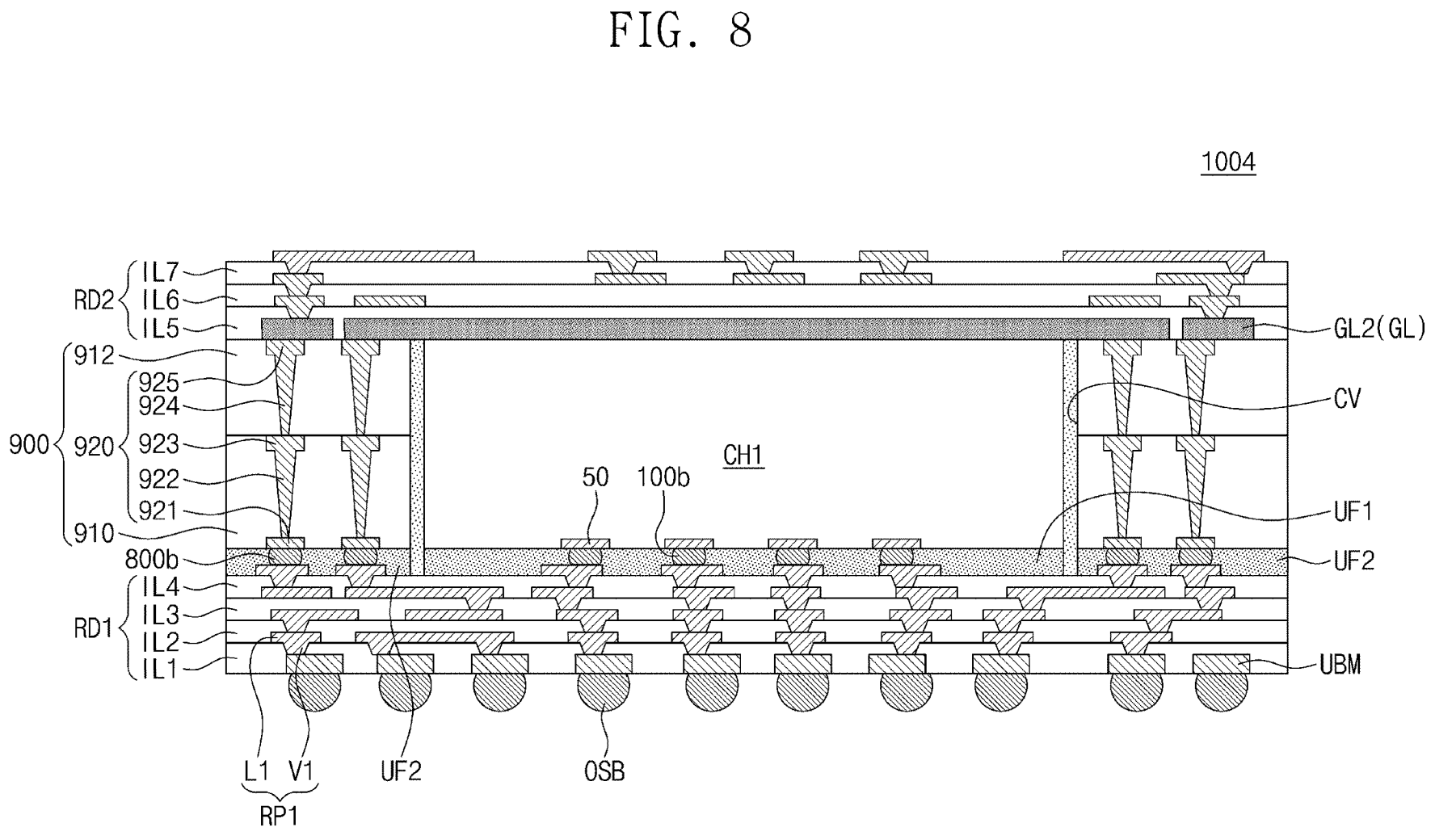

FIG. 8 is a cross-sectional view illustrating a semiconductor package according to some embodiments of the present disclosure.

Referring to FIG. 8, a semiconductor package 1004 according to the present example may have a chip last fan-out panel level package (FOWLP) form.

A connection substrate 900 having a cavity CV at a center is disposed on the first redistribution layer RD1. The first semiconductor chip CH1 is inserted into the cavity CV. The first semiconductor chip CH1 and the connection substrate 900 are covered with the mold layer MD. A portion of the mold layer MD1 may be inserted into the cavity CV and interposed between the first semiconductor chip CH1 and the connection substrate 900.

The connection substrate 900 may include a plurality of base layers 910 and 912 and a conductive structure 920. The connection substrate 900 illustrated in FIG. 8 includes two base layers 910 and 912, for example, a first base layer 910 and a second base layer 912. The connection substrate 900 may include three or more base layers in certain embodiments. The base layers 910 and 912 may include or be formed of an insulating material. For example, the base layers 910 and 912 may include or be formed of a carbon-based material, ceramic, or polymer.

The conductive structure 920 may include a connection pad 921, a first connection via 922, a first connection wiring 923, a second connection via 924, and a second connection wiring 925. In this example, the first connection via 922 and the first connection wiring 923 may be integrally formed, e.g., as one body in the same pattern forming (e.g., photolithography) process. The second connection via 924 and the second connection wiring 925 may be integrally formed, e.g., as one body in the same pattern forming (e.g., photolithography) process. The conductive structure 920 may include or be formed of a metal such as copper, aluminum, gold, nickel, or titanium. The connection pad 921 may be electrically connected to the redistribution pattern RP1 of the first redistribution layer RD1 by an internal connection member 100$b$.

The first semiconductor chip CH1 may be spaced apart from the first redistribution layer RD1 and a first underfill layer UF1 may be interposed therebetween. The connection substrate 900 may be spaced apart from the first redistribution layer RD1 and a second underfill layer UF2 may be interposed therebetween. The first underfill layer UF1 and the second underfill layer UF2 may include or be formed of an epoxy resin. The first underfill layer UF1 and the second underfill layer UF2 may further include an inorganic or organic filler in certain embodiments. Other configurations may be the same as or similar to those described with reference to FIGS. 1 and 2.

In the semiconductor package according to embodiments of the present disclosure, when the recess region is formed during the grinding process of the molding part, the metal layer may fill the recess region and be disposed on the molding part, and thus the short circuiting of the redistribution pattern of the redistribution layer and/or the defects due to the recessed region may be prevented when the redistribution layer is disposed on the metal layer.

Also, the plurality of holes exposing the mold layer may be formed in the metal layer, and thus the gases generated in the mold layer may be released, e.g., through the holes.

In addition, the portion of the metal layer may serve as the electromagnetic interference (EMI) shield, thereby improving the electrical characteristics of the semiconductor package Accordingly, the reliability of the semiconductor package may be improved.

Even though different figures illustrate variations of exemplary embodiments and different embodiments disclose different features from each other, these figures and embodiments are not necessarily intended to be mutually exclusive from each other. Rather, features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally to form additional embodiments unless the context indicates otherwise.

While embodiments are described above, a person skilled in the art may understand that many modifications and variations are made without departing from the spirit and scope of the present disclosure defined in the following claims. Accordingly, the example embodiments of the present disclosure should be considered in all respects as illustrative and not restrictive, with the spirit and scope of the present disclosure being indicated by the appended claims.

What is claimed is:

1. A semiconductor package comprising:
a first redistribution layer;
a semiconductor chip on the first redistribution layer;
a mold layer covering a side surface of the semiconductor chip and a top surface of the first redistribution layer and having an upper surface coplanar with an upper surface of the semiconductor chip;
a metal layer in contact with and covering an upper surface of the semiconductor chip and a portion of an upper surface of the mold layer; and
a second redistribution layer on the metal layer.

2. The semiconductor package of claim 1, further comprising a plurality of mold vias passing through the mold layer and connected to the first redistribution layer and the metal layer,
wherein the plurality of mold vias includes:
a first mold via configured to receive a ground voltage; and
a second mold via configured to receive a signal voltage.

3. The semiconductor package of claim 2, wherein the metal layer includes:
a first part connected to the first mold via; and
a second part connected to the second mold via and spaced apart from the first part.

4. The semiconductor package of claim 3, wherein the first part extends to cover upper surfaces of the semiconductor chip and the first mold via.

5. The semiconductor package of claim 3, wherein the plurality of mold vias includes a plurality of first mold vias, and the first part extends to cover the plurality of first mold vias and the semiconductor chip.

6. The semiconductor package of claim 3, wherein the second mold via is one of a plurality of second mold vias included in the plurality of mold vias, the second part of the metal layer is one of a plurality of second parts included in the metal layer, and the plurality of second parts correspond to the plurality of second mold vias in a one-to-one manner.

7. The semiconductor package of claim 1, wherein a recess region is formed on an upper surface of the mold layer, and
wherein the metal layer fills the recess region.

8. The semiconductor package of claim 7, wherein the second redistribution layer includes a second redistribution pattern overlapping the recess region, and
wherein a lower surface of the second redistribution pattern is flat.

9. The semiconductor package of claim 1, wherein the metal layer includes a plurality of holes exposing the mold layer.

10. A semiconductor package comprising:
a first redistribution layer;
a semiconductor chip on the first redistribution layer;
a plurality of mold vias spaced apart from the semiconductor chip on the first redistribution layer and having the same height as the semiconductor chip;

a mold layer covering a side surface of the first semiconductor chip and a top surface of the first redistribution layer, having an upper surface coplanar with an upper surface of the semiconductor chip, and having a recess region formed on the upper surface thereof;
a metal layer on the mold layer and filling the recess region; and
a second redistribution layer on the metal layer.

11. The semiconductor package of claim 10, wherein the plurality of mold vias include:
a first mold via configured to receive a ground voltage; and
a second mold via configured to receive a signal voltage,
wherein the metal layer includes:
a first part connected to the first mold via; and
a second part connected to the second mold via and spaced apart from the first part.

12. The semiconductor package of claim 11, wherein the first mold via is one of a plurality of first mold vias included in the plurality of mold vias, and the first part extends to cover the plurality of first mold vias and the semiconductor chip.

13. The semiconductor package of claim 11, wherein the second mold via is one of a plurality of second mold vias included in the plurality of mold vias, the second part is one of a plurality of second parts included in the metal layer, and the plurality of second parts correspond to the plurality of second mold vias in a one-to-one manner.

14. The semiconductor package of claim 10, wherein the second redistribution layer includes a second redistribution pattern overlapping the recess region, and
wherein a lower surface of the second redistribution pattern is flat.

15. The semiconductor package of claim 10, wherein the metal layer includes a plurality of holes exposing the mold layer.

16. A semiconductor package comprising:
a first redistribution layer;
a semiconductor chip on the first redistribution layer;
a plurality of mold vias extending parallel to side surfaces of the semiconductor chip on the first redistribution layer and having the same height as the semiconductor chip, the plurality of mold vias including a first mold via configured to receive a ground and a second mold via configured to receive a signal voltage;
a mold layer covering a side surface of the first semiconductor chip, a side surface of each of the plurality of mold vias, and a top surface of the first redistribution layer, having an upper surface coplanar with an upper surface of the semiconductor chip, and having a recess region formed on the upper surface thereof;
a metal layer on the mold layer and filling the recess region, the metal layer including a first part connected to the first mold via, and a second part connected to the second mold via and spaced apart from the first part; and
a second redistribution layer on the metal layer.

17. The semiconductor package of claim 16, wherein the first part extends to cover the semiconductor chip and an upper surface of the first mold via.

18. The semiconductor package of claim 16, wherein the first mold via is one of a plurality of first mold vias included in the plurality of mold vias, and the first part extends to cover the plurality of first mold vias and the semiconductor chip.

19. The semiconductor package of claim 16, wherein the second mold via is one of a plurality of second mold vias included in the plurality of mold vias, the second part is one of a plurality of second parts included in the metal layer, and the plurality of second parts correspond to the plurality of second mold vias in a one-to-one manner.

20. The semiconductor package of claim 16, wherein the metal layer includes a plurality of holes exposing the mold layer.

* * * * *